(12) United States Patent
Koenemann et al.

(10) Patent No.: US 7,509,551 B2
(45) Date of Patent: Mar. 24, 2009

(54) DIRECT LOGIC DIAGNOSTICS WITH SIGNATURE-BASED FAULT DICTIONARIES

(76) Inventors: Bernd Koenemann, 1051 Coleman Rd., Apt. 3303, San Jose, CA (US) 95123; Manish Sharma, 25780 SW. Canyon Creek Rd., C301, Wilsonville, OR (US) 97070

( * ) Notice: Subject to any disclaimer, the term of this patent is extended or adjusted under 35 U.S.C. 154(b) by 374 days.

(21) Appl. No.: 11/497,977

(22) Filed: Aug. 1, 2006

(65) Prior Publication Data
US 2007/0038911 A1   Feb. 15, 2007

Related U.S. Application Data

(60) Provisional application No. 60/704,572, filed on Aug. 1, 2005.

(51) Int. Cl.
*G01R 31/28* (2006.01)
*G06F 11/00* (2006.01)

(52) U.S. Cl. .................. 714/732; 714/737; 714/741
(58) Field of Classification Search ................. None
See application file for complete search history.

(56) References Cited

U.S. PATENT DOCUMENTS

| | | | |
|---|---|---|---|
| 5,831,992 A | 11/1998 | Wu | |
| 5,930,270 A | 7/1999 | Forlenza et al. | |
| 6,202,181 B1 | 3/2001 | Ferguson et al. | |
| 6,314,540 B1 | 11/2001 | Huott et al. | |
| 6,442,723 B1 | 8/2002 | Koprowski et al. | |
| 6,532,440 B1 | 3/2003 | Boppana et al. | |
| 6,675,323 B2 * | 1/2004 | Bartenstein et al. | ........... 714/29 |
| 6,678,837 B1 * | 1/2004 | Quach et al. | ................. 714/38 |
| 6,721,914 B2 | 4/2004 | Bartenstein et al. | |
| 6,754,864 B2 * | 6/2004 | Gangl et al. | ................ 714/733 |
| 6,971,054 B2 * | 11/2005 | Kurtulik et al. | ............. 714/732 |
| 7,185,253 B2 * | 2/2007 | Mitra et al. | ................. 714/734 |
| 7,191,374 B2 * | 3/2007 | Maamari et al. | ............ 714/738 |
| 2003/0115525 A1 | 6/2003 | Hill et al. | |
| 2006/0066338 A1 | 3/2006 | Rajski et al. | |

OTHER PUBLICATIONS

Bardell et al., "Production Experience with Built-In Self-Test in the IBM ES/9000 System," *Proc. ITC*, pp. 28-36 (1991).
Barnhart et al., "Extending OPMISR beyond 10x Scan Test Efficiency," *IEEE Design & Test of Computers*, pp. 65-73 (Sep.-Oct. 2002).
Barnhart et al., "OPMISR: The Foundation for Compressed ATPG Vectors," *Proc. ITC*, pp. 748-757 (2001).

(Continued)

*Primary Examiner*—Christine T Tu
(74) *Attorney, Agent, or Firm*—Klarquist Sparkman, LLP

(57) ABSTRACT

Disclosed herein are representative embodiments of methods, apparatus, and systems for performing diagnostic from signatures created during circuit testing. For example, in one exemplary method disclosed herein, a signature produced by a signature generator is received. In this embodiment, the signature corresponds to the circuit's response to no more than one test pattern. The signature is compared to entries of a fault dictionary, an entry of the fault dictionary is matched to the signature if the entry identifies a fault that explains the signature, and the fault is stored in a list of fault candidates.

42 Claims, 8 Drawing Sheets

OTHER PUBLICATIONS

Bartenstein et al., "Diagnosing Combinational Logic Designs Using the Single Location At-a-Time (SLAT) Paradigm," *Proc. ITC*, pp. 287-296 (2001).

Bayraktaroglu et al., "Gate Level Fault Diagnosis in Scan-Based BIST," *Proc. DATE*, pp. 376-381 (2002).

Chan et al., "A Study of Faulty Signatures Using a Matrix Formulation," *Proc. ITC*, pp. 553-561 (1990).

Cheng et al., "Compactor Independent Direct Diagnosis," *Proc. ATS*, pp. 204-209 (2004).

Clouqueur et al., "Efficient Signature-Based Fault Diagnosis Using Variable Size Windows," *Proc. VLSI Design Conference*, pp. 391-396 (2000).

Ghosh-Dastidar et al., "Fault Diagnosis in Scan-Based BIST Using Both Time and Space Information," *Proc. ITC*, pp. 95-102 (1999).

Gong et al., "Locating Bridging Faults Using Dynamically Computed Stuck-At Fault Dictionaries," *IEEE Trans. CAD*, pp. 876-887 (1998).

Konemann et al., "Built-In Logic Block Observation Techniques," *IEEE Test Conference*, 6 pp. (1979).

Liu et al., "A Partition-Based Approach for Identifying Failing Scan Cells in Scan-BIST with Applications to System-on-Chip Fault Diagnosis," *Proc. DATE*, pp. 230-235 (2003).

Liu et al., "Compact Dictionaries for Diagnosis of Unmodeled Faults In Scan-BIST," *IEEE International Symposium on VLSI (ISVLSI) Conference*, pp. 173-178 (2004).

Liu et al., "Compact Dictionaries for Fault Diagnosis in Scan-BIST," *IEEE Trans. on Computers*, vol. 53, No. 6, pp. 775-780 (2004).

Liu et al., "Incremental Fault Diagnosis," *IEEE Trans. on CAD*, vol. 24, No. 2, pp. 240-251 (2005).

Mitra et al., "X-Compact: An Efficient Response Compaction Technique," *IEEE Trans. CAD*, pp. 421-432 (2004).

Pateras, "IP for Embedded Diagnosis," *IEEE Design and Test of Computers*, pp. 46-55 (May-Jun. 2002).

Rajski et al., "Fault Detection and Diagnosis Based on Signature Analysis," *IEEE International Symposium on Circuits and Systems*, pp. 1877-1880 (1991).

Rajski et al., "Fault Diagnosis in Scan-Based BIST," *Proc. ITC*, pp. 894-902 (1997).

Ryan et al., "Dynamic Fault Dictionaries and Two-Stage Fault Isolation," *IEEE Trans. on VLSI Systems*, vol. 6, No. 1, pp. 176-180 (Mar. 1998).

Sato et al., "Failure Analysis of Open Faults by Using Detecting/Undetecting Information on Tests," *Proc. ATS*, pp. 222-227 (2004).

Savir, "Salvaging Test Windows in BIST Diagnostics," *IEEE Trans. on Computers*, vol. 47, No. 4, pp. 486-491 (Apr. 1998).

Sun et al., "Error Identification and Data Recovery in MISR-based Data Compaction," *Workshop on Defect and Fault-Tolerance in VLSI Systems*, pp. 252-260 (1997).

Venkataraman et al., "A Technique for Logic Fault Diagnosis of Interconnect Open Defects," *Proc. VLSI*, pp. 313-318 (2000).

Waicukauski et al., "Failure Diagnosis of Structured VLSI," *IEEE Design and Test of Computers*, pp. 49-60 (Aug. 1989).

Wohl et al., "Effective Diagnostics through Interval Unloads in a BIST Environment," *Proc. DAC*, pp. 249-254 (2002).

Xu et al., "Gate-Level Fault Diagnosis for Scan-Based VLSI Environment," *Canadian Conf. on Electrical and Computer Engineering*, vol. 1, pp. 390-393 (2000).

\* cited by examiner

DIRECT LOGIC DIAGNOSTICS WITH SIGNATURE-BASED FAULT DICTIONARIES

CROSS REFERENCE TO RELATED APPLICATIONS

This application claims the benefit of U.S. Provisional Patent Application No. 60/704,572 filed Aug. 1, 2005, which is hereby incorporated herein by reference.

FIELD

This application relates to diagnosing faults in an integrated circuit.

BACKGROUND

The accurate diagnosis of faults is an increasingly important aspect of testing integrated circuits, especially in view of ever-increasing gate counts and shrinking feature sizes. For circuits that do not utilize compression techniques during testing, fault diagnosis is relatively straightforward. For circuits that have embedded compression hardware, however, accurate fault diagnosis presents a formidable challenge.

Automated fault diagnosis (e.g., diagnosis based on test responses from test patterns generated using automated test pattern generation ("ATPG") or built-in self-test hardware, such as Logic BIST) is a desirable component of an overall failure-analysis process. Automated fault diagnosis is generally used to predict the location of a failure in a CUT and has applications in such fields as silicon debugging, yield learning, and yield improvement. Given a set of failing test responses (e.g., failing signatures or error signatures) to a set of test patterns, an automated fault diagnosis tool desirably identifies the suspect fault sites (fault candidates) that best explain the failures. The suspect sites identified can help locate the physical cause of the fault and be used to guide failure analysis at the physical level.

Conventional logic diagnostic tools for scan-based tests often use full bit-level fail sets. These fail sets typically consist of the entire bit-level test response in which an unexpected or faulty value is captured after application of a test pattern. Thus, the fail sets not only indicate which scan test of the test set failed, but also, for each failing scan test, which response bit or bits failed (that is, which scan cell captured the unexpected or faulty value). (As used herein, the term "scan test" or "test" refers to the application of a test pattern and the capturing and unloading of the test response to the test pattern.) Typically, diagnostic software compares one or more actual fail sets with simulated fail sets. These simulated fail sets can be created, for example, by injecting one fault at a time from a fault list into a representation of the design-under-test (e.g., based on the netlist of the design under test) and fault simulating each fault for all or some of the scan tests. The simulated fail sets can thus identify which response bit or bits fail for a given test and for a given fault. Actual fail set information can be compared to the simulated fail set information in order to identify faults whose fail behavior is compatible with the observed fail behavior in the actual fail set. Some diagnostic techniques require a complete match to exist between the simulated and actual fail bits before declaring a fault as a potential candidate, whereas other diagnostic techniques allow for some small differences. The potential candidates can then be sorted, for example, by how well each candidate explains the fail/no-fail behavior across a plurality of tests for which fail set data exist (for example, for all or portions of tests of a given test set).

The fault simulation steps that create the simulated fail sets can be performed at various stages of the diagnostic process. For example, the simulated fail sets can be generated before testing, thereby generating a pre-calculated fault dictionary, or as a fail set is being analyzed after testing, thereby resulting in post-test simulation.

FIG. 1 is a block diagram 100 illustrating an exemplary method for fault diagnosis using a pre-calculated fault-dictionary approach for a circuit-under-test having no compression hardware. The exemplary method is divided into three phases: a pre-test processing phase 110, a test phase 112, and a post-test processing phase 114. In the pre-test processing phase 110, fault simulation 120 is performed to generate a fault dictionary 122 comprising entries that indicate what faults may have generated an observed failing response. Fault simulation 120 can be performed, for example, by simulating the presence of one or more faults (defined by a fault list 124) in the design-under-test (defined, for example, by a netlist 126 or other design database) as one or more test patterns 128 are applied to the design-under-test. In FIG. 1, the resulting fault dictionary entries correspond to the full failing test responses (the "uncompressed symptoms"). The resulting dictionary can be stored on computer-readable media for use in diagnostics during the post-test processing phase 114.

In the test phase 112, testing 130 of actual circuits is performed. For example, production or manufacture testing of integrated circuits is performed using one or more testers coupled to the circuits shortly after the integrated circuits are manufactured. Testing 130 may also be performed at any time after manufacturing. Testing 130 can generate one or more failing test responses, which can be compiled and stored as one or more uncompressed fail sets 132.

In the post-test processing stage 114 (which can also occur substantially simultaneously with testing 130), the uncompressed fail sets 132 from testing 130 are compared and matched 140 with entries from the fault dictionary 122. A list of potential fault locations 142 (also referred to as "fault candidates" or "callouts") is produced as a result of the comparison and matching 140. The list of fault candidates can then be used to help locate the actual fault site on the failing circuit.

FIG. 2 is a block diagram 200 illustrating an exemplary method of diagnosing faults using a post-test simulation approach in which fault dictionaries are dynamically generated. As with FIG. 1, the method illustrated in FIG. 2 is performed for circuits that do not have compression hardware. The method of FIG. 2 comprises two stages: a test stage 210 and a post-test processing stage 212. In the test phase 210, testing 220 of actual circuits is performed. For example, production or manufacture testing of integrated circuits is performed using one or more testers coupled to the circuits shortly after the integrated circuits are manufactured. Testing 220 may also be performed at any time after manufacturing. Testing 220 can generate one or more failing test responses, which can be compiled and stored as one or more uncompressed fail sets 222.

In the post-test processing stage 212 (which can also occur substantially simultaneously with testing 220), the uncompressed fail sets 222 from testing 220 are analyzed by a fault diagnosis tool. The fault diagnosis typically comprises cone tracing 230 from one or more of the failing scan cells identified in the uncompressed fail sets as capturing unexpected values. For example, a backward cone tracing procedure from the observed error locations of the fail set can be performed. The observed error locations correspond to the output and/or scan cell values that do not match the expected response. As a result of cone tracing 230, a partial fault list 232 is generated. Fault simulation 240 is performed using faults from the fault list 232. Fault simulation 240 can be performed, for example, by simulating the presence of the potential faults (defined by the partial fault list 232) in the design-under-test (defined, for example, by a netlist 242 or other design database) as the test patterns 244 that caused the observed failures are applied to the design-under-test. Post-test fault simulation run times are dependent at least in part on the number of faults that must be simulated for each fail set. The potential fault locations to be simulated are ordinarily confined to those in the back-trace cones. Run-times can often be further reduced using logic consistency checking. In general, if the error locations are known exactly or can at least be tightly bounded, the number of fault candidates considered in post-test simulation can be effectively reduced. A dynamic fault dictionary 246 is generated as a result of fault simulation 240. The entries of the dynamic fault dictionary 246 correspond to the full failing test responses (the "uncompressed symptoms") resulting from the potential faults in the partial fault list. At 250, the uncompressed symptoms are compared and matched with the actual uncompressed fail sets to determine which faults best explain the observed test responses. A list of potential faults locations 252 (also referred to as "fault candidates" or "callouts") is produced as a result of the comparison and matching 250. The list of potential fault sites can then be used to help locate the actual fault site on the failing circuit.

The use of compression during the testing of integrated circuits has become widespread. In general, compression helps reduce the volume of test data required for even traditional stuck-at test sets. Such sets, for example, often exceed the capacity of automatic test equipment ("ATE") used to test today's multimillion-gate integrated circuits. Moreover, due to the limited bandwidth between the circuit-under-test ("CUT") and the ATE, the use of compressed test data and compressed test responses can decrease test time, and thus the test cost.

Accordingly, methods, apparatus, and systems for diagnosing faults from compressed test responses (e.g., from signature generators, such as multiple-input signature registers ("MISRs")) are desired.

SUMMARY

Described below are exemplary methods, apparatus, and systems for diagnosing faults (e.g., on devices having embedded compression hardware). In particular, the disclosed technology concerns diagnosing faults from signatures produced by sequential (or time) compactors, such as multiple input signature registers ("MISRs").

In one embodiment, a method of diagnosing faults in a circuit is disclosed. In this embodiment, a signature produced by a signature generator is received. The signature corresponds to the circuit's response to no more than one test pattern. The signature is compared to entries of a fault dictionary. An entry of the fault dictionary is matched to the signature if the entry identifies a fault that explains the signature. The fault is stored in a list of fault candidates. The signature generator can be located on the circuit, and the signature can be produced by the signature generator during production testing of the circuit. The signature generator can also be a representation of a signature generator. In this implementation, for example, the circuit's bit-level response to the test pattern can be received and the signature corresponding to the circuit's bit-level response can be determined using the representation of the signature generator. In certain implementations, the signature can correspond to the circuit's response to a portion of a test pattern, and subsequent signatures can correspond to the circuit's remaining response to the test pattern. In still other embodiments, the signature corresponds to five or fewer test patterns. The list of fault candidates can be an initial list of fault candidates, and two or more of the fault candidates can be combined into one or more groups of composite fault behavior types. One or more of the fault candidates in the list can be simulated, and additional fault candidates can be identified based at least in part on the simulation. One or more additional entries for the fault dictionary can be generated using one or more of the fault candidates in the list. The additional entries can be, for example, in the back-trace cones of the one or more fault candidates used to generate the additional entries. Additional fault candidates can also be identified based on their physical proximity to the fault candidates in the list of the fault candidates. The signature can be an error signature that indicates the difference between an observed signature and an expected signature. The signature can also be a raw signature output from the signature generator. The signature generator can be reset to a known state before a next signature is generated. The act of storing can include storing the fault in the list of fault candidates only if the fault has been observed a fixed number of times in signatures received from the circuit. The method of this embodiment can be performed by a tester coupled to the circuit during testing, or by a workstation not coupled to the tester.

Another disclosed embodiment is a method of producing a signature-based fault dictionary for use in diagnosing faults in a circuit. In this embodiment, a description of a circuit design is received. A response of the circuit design to application of a test pattern is simulated. The simulation includes simulating the presence of one or more faults in the circuit design. A signature generator is simulated at least partially loading the test response and generating a signature for the at least partially loaded test response. An entry in a fault dictionary associated with the signature and indicative of the one or more faults if the signature is a failing signature is stored. The signature simulation can be for a portion of the test response or for the entire test response. The entry stored in the fault dictionary can include the signature itself and/or an error signature produced from the signature. The entries of the fault dictionary can be compressed. The acts of simulating and storing can be repeated for additional respective test patterns. Further, the repeating can include simulating the presence of a respective fault during the simulating until the respective fault is detected in a predetermined number of signatures. Thereafter, the respective fault can be removed from the list of faults to be simulated. The faults can be modeled faults comprising stuck-at faults, transition faults, or both stuck at-faults and transition faults.

Another disclosed embodiment is a system comprising a circuit-under-test having one or more scan chains, a signature generator (e.g., a multiple input signature register ("MISR")) having inputs coupled to outputs of the one or more scan chains, and a signature analysis subsystem coupled to receive the signatures from the signature generator. In this embodiment, the signature generator is operable to generate signatures associated with at least a portion of one or more circuit test responses captured in the scan chains. The signature generator is further operable to output the signatures after an interval of scan cycles. The interval can correspond to five or fewer, two or fewer, or one or fewer circuit responses being loaded into the signature generator. The signature analysis subsystem of this embodiment is configured to compare a respective signature received from the signature generator to entries of a fault dictionary and to create a list of potential fault candidates if the respective signature is a failing signature and if the failing signature matches one or more entries in the fault dictionary. In this embodiment, the one or more matching entries of the fault dictionary identify the potential fault candidates that are included in the list. The system can also comprise circuit components coupled to the signature generator that are configured to reset the signature generator to a known state after the interval of scan cycles. The system can also comprise masking hardware coupled between the inputs of the signature generator and the outputs of the scan chains. The masking hardware can be configured to mask one or more outputs of the scan chains for one or more scan cycles. The system can also comprise a linear phase shifting network coupled between the inputs of the signature generator and the outputs of the scan chains. The system can also comprise a spatial compactor coupled between the inputs of the signature generator and the outputs of the scan chains. The signature analysis subsystem can comprise a data logging subsystem configured to receive the signatures and associate the received signatures with information indicative of one or more of: (a) an identity of the circuit-under-test with which a respective received signature is associated, (b) the content of the failing signature, and (c) an identity of the interval with which the respective received signature is associated.

Any of the disclosed methods can be implemented as computer-readable media comprising computer-executable instructions for causing a computer to perform the methods. Further, computer-readable media storing lists of fault candidates or faulty scan cell candidates identified by any of the disclosed methods, or storing circuit descriptions created or modified by the disclosed methods are also disclosed. Circuits having faults that were repaired or designs that were modified after fault detection by any of the disclosed methods are also disclosed.

The foregoing and additional features and advantages of the disclosed embodiments will become more apparent from the following detailed description, which proceeds with reference to the following drawings.

DETAILED DESCRIPTION

Figure 1:
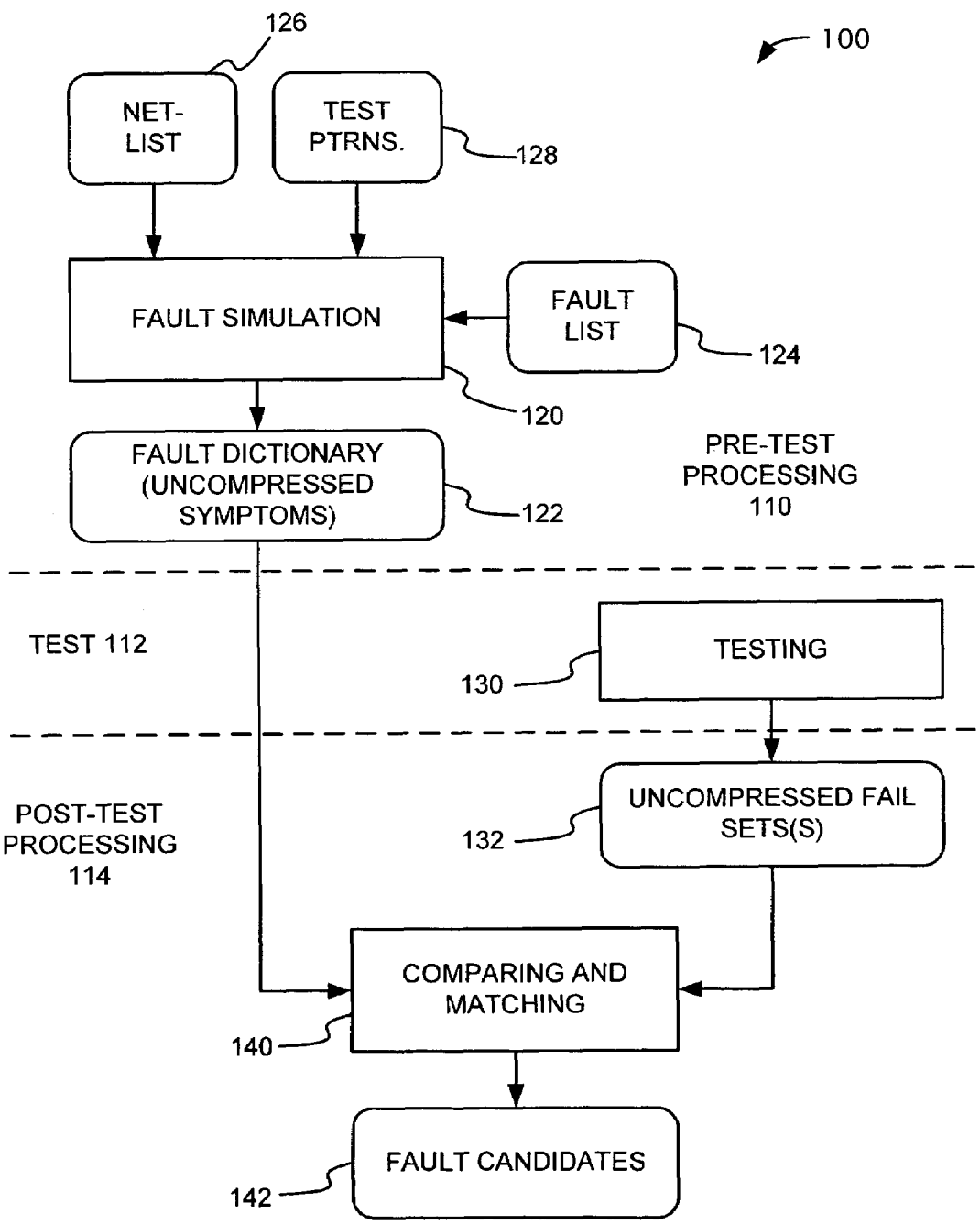
FIG. 1 is a schematic block diagram illustrating an exemplary method of a conventional fault diagnosis using a pre-calculated fault-dictionary approach for a circuit-under-test having no compression hardware.

Disclosed below are representative embodiments of methods, apparatus, and systems for performing fault diagnosis that should not be construed as limiting in any way. Instead, the present disclosure is directed toward all novel and non-obvious features and aspects of the various disclosed methods, apparatus, and systems, alone and in various combinations and subcombinations with one another. The disclosed technology is not limited to any specific aspect or feature, or combination thereof, nor do the disclosed methods, apparatus, and systems require that any one or more specific advantages be present or problems be solved.

Any of the methods, apparatus, and systems described herein can be used in conjunction with a wide variety of scan-based or partially-scan-based circuits. Further, the fault candidates identified need not be of a particular type, but can vary from implementation to implementation (e.g., stuck-at faults, transition faults, bridging faults, and other such faults).

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine" and "identify" to describe the disclosed technology. These terms are high-level abstractions of the actual operations that are performed. The actual operations that correspond to these terms will vary depending on the particular implementation and are readily discernible by one of ordinary skill in the art.

As used in this application and in the claims, the singular forms "a" "an," and "the" include the plural forms unless the context clearly dictates otherwise. Additionally, the term "includes" means "comprises." Further, the term "coupled" means electrically or electromagnetically connected or linked and includes both direct connections or direct links and indirect connections or indirect links through one or more intermediate elements.

The disclosed embodiments can be implemented in a wide variety of environments. For example, any of the disclosed techniques can be implemented in software comprising computer-executable instructions stored on computer-readable media (e.g., one or more CDs, volatile memory components (such as DRAM or SRAM), or nonvolatile memory components (such as hard drives)). Such software can comprise, for example, electronic design automation ("EDA") software (e.g., a logic built-in self-test ("LBIST") tool or automatic test pattern generation ("ATPG") tool) used to design and synthesize BIST hardware for a particular design-under-test, perform fault simulation, dictionary generation, and/or fault diagnostics for the design-under-test. The design-under-test can be implemented in a variety of different circuits, including application specific integrated circuits ("ASICs"), programmable logic devices ("PLDs") such as field-programmable gate arrays ("FPGAs"), and systems-on-a-chip ("SoCs") having digital, analog, or mixed-signal components thereon. These particular software implementations should not be construed as limiting in any way, however, as the principles disclosed herein are generally applicable to other software tools. Circuit faults that are detected using the disclosed techniques can in some circumstances be repaired.

Circuits having faults repaired after being detected by any of the disclosed embodiments are also within the scope of this disclosure. Furthermore, circuits having designs or manufacturing parameters that were modified as a result of faults being detecting using any of the disclosed embodiments are also within the scope of this disclosure.

Any of the software embodiments described above can be executed in a single computer, a networked computer, or other distributed computing environment (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. For example, the disclosed embodiments can be implemented using a wide variety of commercially available computer languages, computer systems, and/or testing systems. Any of the disclosed methods can alternatively be implemented (partially or completely) in hardware (e.g., an ASIC, PLD, or SoC).

Fault dictionaries or diagnostic results produced from any of the disclosed methods can be created, updated, or stored on computer-readable media (e.g., one or more CDs, volatile memory components (such as DRAM or SRAM), or nonvolatile memory components (such as hard drives)) using a variety of different data structures or formats. For example, a list comprising suspect scan cells or fault candidates (corresponding to possible defect locations in the design-under-test) produced by the application of any of the disclosed embodiments can be stored on computer readable-media. Such diagnostic results can be created or updated at a local computer or over a network (e.g., by a server computer). As used herein, the term "list" refers to a collection or arrangement of data that is usable by a computer system. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database).

The one or more integrated circuits being tested may additionally comprise specialized hardware components used to implement the testing (e.g., BIST hardware for generating test patterns and signatures). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits modified or otherwise improved using embodiments of the disclosed technology or equivalents are considered to be within the scope of this disclosure.

Moreover, any of the disclosed methods can be used in a computer simulation or other EDA environment, where test patterns, test responses, and compressed fail sets (e.g., failing signatures) are determined or otherwise analyzed using representations of circuits, which are stored on one or more computer-readable media. For presentation purposes, the present disclosure sometimes refers to a circuit or circuit component by its physical counterpart (for example, scan chain, MISR, and other such terms). It should be understood, however, that any reference in the disclosure or the claims to a physical component includes both the physical component and representation of the physical component as used in simulation or other such EDA environments.

Introduction to the Disclosed Technology

The creation of effective and efficient fault dictionaries often requires undesirably long run times and unacceptably large volumes of data. In order to keep the run time and data volume low, fault dictionaries can be modified to include just the first test in which a fault fails. The fault is thereafter dropped from further consideration. A dictionary created according to this technique is sometimes referred to as a "stop on first error" or "SOFE" dictionary. Fault dictionaries can also be adjusted to contain test data for various other numbers of tests capturing a given fault. Such dictionaries are therefore sometimes referred to as "stop-on-nth-error" dictionaries, where n>1. A typical SOFE or stop-on-nth-error dictionary, however, does not contain any information about how a circuit would fail in the presence of the fault during later tests. This limited information can adversely impact diagnostic resolution. Nevertheless, diagnosing faults using a smaller SOFE or stop-on-nth error dictionary is still faster than post-test simulation. Indeed, dictionary generation is typically performed just once before testing. Moreover, given the shorter run times of modern fault simulation tools, stop-on-nth-error (n>1) fault dictionary generation is desirable so long as the resulting dictionaries remain compact enough to enable efficient storage, retrieval, and use with the available testing equipment.

Logic Built-In Self-Test (Logic BIST) and test data compression techniques have replaced the bit-for-bit response data in many test architectures with more compact encoded responses. A typical test response compaction method, however, tends to reduce the information available to identify more exact error locations. For example, combinational compactors that have outputs from multiple scan chains mapped onto a single scan-out pin via combinational logic typically preserve information about which scan cycle an error is associated, but may not preserve information about which scan chain the error was captured in. In this situation, and for the post-test simulation approach, back tracing begins from a group of scan cells rather than an individual scan cell, resulting in a larger list of fault candidates for simulation. Post-test simulation run-times are consequently increased.

Sequential compactors (also referred to as "time compactors") such as Multiple-Input Signature Registers (MISRs) typically used for Logic BIST and for some test data compression approaches, essentially hash the error information to an extent where the exact error locations can no longer be reasonably bounded. In these situations, fault candidate identification using the post-test simulation approach is typically not possible and post-test simulation becomes impractical for direct diagnostics from MISR signatures. Instead, conventional approaches to diagnostics for MISR-based compaction schemes typically involve reapplying the failing tests and logging the test responses out to the tester without compaction (for example, in a bypass mode) to produce a bit-level fail set. Many logic testers, however, have a limited fail memory and can log only a small number of fail cycles (for example, 256). Thus, it is not practical to log the contents of a complete scan chain. Only a few response bits, however, tend to be in error for each failing test, and data logging for several tests is possible so long as only cycles containing errors are logged. Furthermore, to determine the error-containing cycles, the tester typically needs to store the expected bit-level responses in memory, which defeats the purpose of using signatures to achieve a reduction in data volume. Moreover, loading the complete set of test responses onto a tester used in production testing can be impractical. Instead, diagnostics using MISR-based schemes often involve the use of sampling plans and/or retesting on diagnostic test stations that have a sufficient number of expected responses loaded into memory.

Embodiments of the technology described herein can be used to overcome these limitations (both individually and in various combinations with one another). For example, certain exemplary embodiments of the disclosed technology are capable of performing dictionary-based diagnostics directly from failing signatures without the need for retest and bit-level data logging. Further, some embodiments of the disclosed technology use a compact, signature-based stop-on-nth-error fault dictionary and a diagnostic technique that is based on the single-location paradigm.

Signature-Based Diagnosis, in General

Figure 2:
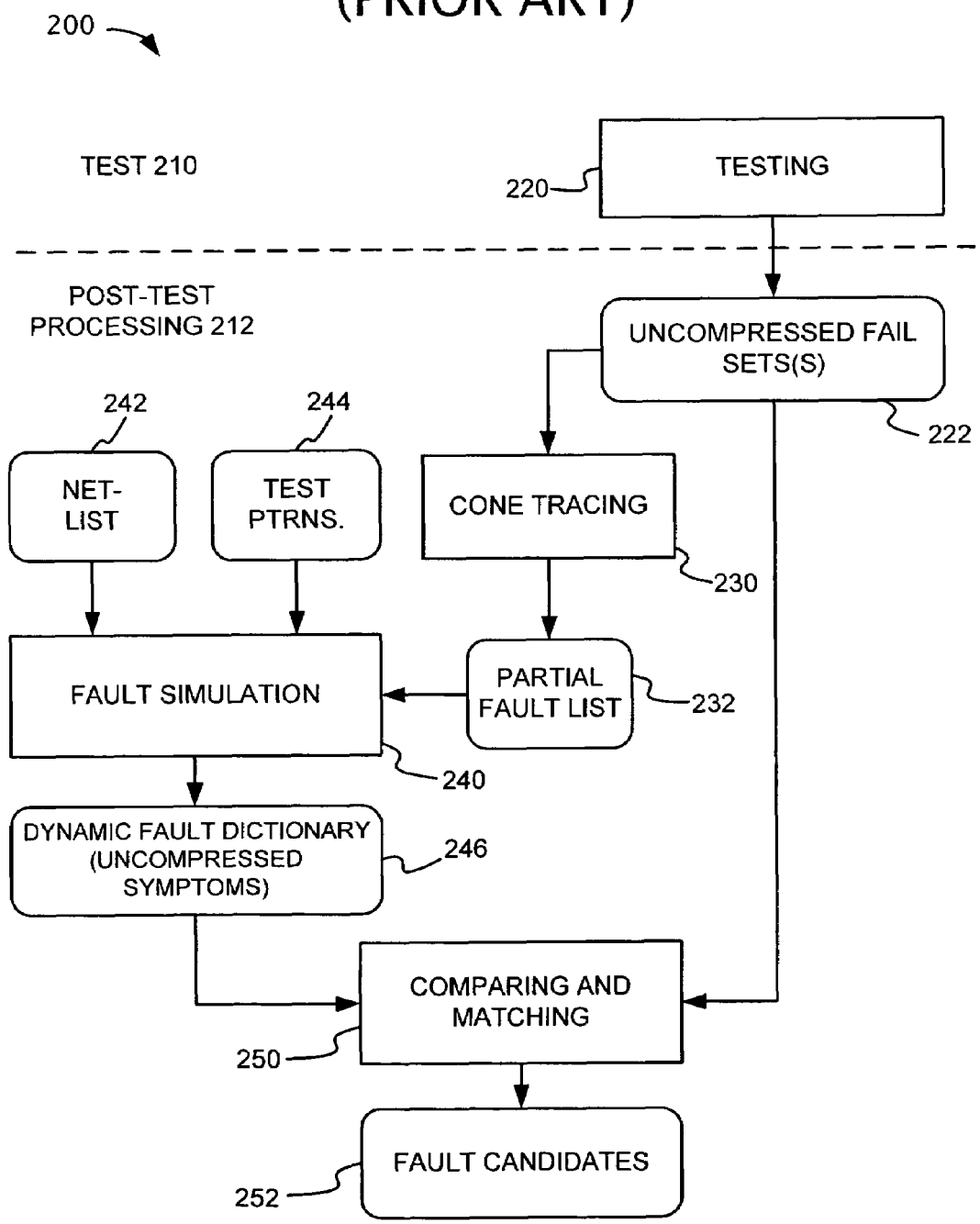
FIG. 2 is a schematic block diagram illustrating an exemplary method of a conventional fault diagnosis using a post-test fault simulation approach for a circuit-under-test having no compression hardware.

As noted above, one conventional diagnostic approach for signature-based testing uses signatures only to identify failing test intervals. Thereafter, subsequent retesting is performed with test patterns from the failing intervals and the bit-level test responses thereto are serially unloaded. The unloaded responses can be compared with expected responses stored on the tester or obtained by "good-machine" simulation. Once the bit-level compare results are known, conventional scan-based logic diagnostics can be used. For example, pre-calculated bit-level static fault dictionaries (as shown in FIG. 1) or dynamic bit-level fault dictionaries created by on-demand post-test simulation (as shown in FIG. 2) can be used. A list of the suspect fault locations can be determined by matching the simulated error locations in the dictionary entries to the actual error locations in the fail set logged by the tester. Various matching criteria can be used to determine whether a match or non-match should be scored. The result of the procedure is typically a list of suspect fault locations and fault types ranked by a score.

Actual defect behaviors, however, do not always match the fault behavior of the model faults used in static and/or dynamic dictionary creation. The matching and scoring methodology used during diagnosis therefore desirably accounts for this behavior. For instance, the matching criteria can require an exact match (for instance, all error locations and non-error locations must match for a fault and test under consideration) or an approximate match (for instance, the error and non-error locations must mostly match for a fault and test under consideration). Approximate matching, however, is typically not easily implemented in signature-based diagnostic approaches because, for most signature methods, proximity in error location does not necessarily translate into proximity in the signature. Exact matching, however, is possible because an error signature predicted from simulated error locations will exactly match the actual signature error if the simulated and actual error locations are the same. Accordingly, exact matching diagnostic methods are well-suited and desirably used for direct diagnosis from signatures.

Exact matching methods ordinarily rely on the premise that for at least some failing tests, the defect will behave like a model fault (for example, a single stuck-at fault). The defect behavior may, however, not be consistent for all failing and passing tests. For example, the same net may fail with opposite fail behaviors in different tests and/or different fault locations may match in different tests. A bridging defect between two nets is a good example. The bridge can affect the behavior of both nets. Consequently, one of the nets may fail in one test while the other net fails in another test. Still further, it is possible that the bridge will establish some intermediate voltage level such that both nets fail in the same test, whereas in another test the intermediate voltage leads to no downstream misbehavior. Moreover, if a fan-out is involved, intermediate voltages can cause misbehavior on some, but not all, of the fan-out branches. This type of fail-behavior usually does not match any single location fail behavior in a test.

Table 1 below illustrates an example of this behavior. Specifically, Table 1 indicates the fail behavior for 10 exemplary test patterns. Three of the ten tests in this example fail with three different single location fail behaviors (labeled "$f_1$," "$f_2$," and "$f_3$," respectively), and two tests fail with no single location fail behavior (labeled "other"). The remaining five tests do not fail at all (labeled "-").

TABLE 1

First Example of Fail Behavior for Ten Consecutive Test Patterns

| Test Pattern | 1 | 2 | 3 | 4 | 5 | 6 | 7 | 8 | 9 | 10 |
|---|---|---|---|---|---|---|---|---|---|---|
| Pass/Fail | P | P | F | F | P | F | F | P | P | F |
| Symptom | — | — | $f_1$ | $f_2$ | — | other | $f_3$ | — | — | other |

Diagnosing each test separately with a single location paradigm can result in an exact match for the failing tests 3, 4, and 7, while no exact match would be possible for the failing tests 6 and 10. This diagnostic result is illustrated in the Table 2 below.

TABLE 2

Diagnostic Results of First Example Using Exact Matching Criteria

| Test Pattern | 1 | 2 | 3 | 4 | 5 | 6 | 7 | 8 | 9 | 10 |
|---|---|---|---|---|---|---|---|---|---|---|
| Pass/Fail | P | P | F | F | P | F | F | P | P | F |
| Symptom | — | — | $f_1$ | $f_2$ | — | other | $f_3$ | — | — | other |
| Single Location Match | — | — | Yes | Yes | — | No | Yes | — | — | No |

In this example, the exact matching approach creates an initial list of suspect fault locations ("$f_1$," "$f_2$," and "$f_3$" in the example) and fault types. This initial list may be further analyzed in order to refine the diagnostic results. This additional analysis can, for example, attempt to combine individual fault behaviors into composite behaviors that achieve a higher score than the individual behaviors. Or, new model faults with modified excitation and/or propagation criteria can be derived from the initial suspect list in an attempt to create more matches.

The effectiveness of post-test simulation methods depends at least in part on whether the number of potential fault candidates for simulation can be reduced. One approach to fault candidate reduction involves back-tracing from the error locations (from scan-cells and/or primary outputs with values that did not match the expected values) and restricting the suspect locations to intersecting locations in the associated back-trace cones. This approach is typically most effective when exact error locations are known or can at least be tightly bounded. For example, full scan-test fail sets (e.g., fail sets from scan dump after signature mismatch) ordinarily contain exact error locations. Fail sets from combinational compactors typically also contain information about the error locations that is sufficiently tightly bounded to permit back-tracing, albeit at the expense of slightly larger back-trace cones. Signatures, however, do not ordinarily contain sufficiently bounded error locations for effective fault reduction.

Although certain known methods can be used to extract at least some error location information from signature-based tests, these methods have previously not been adopted for production use and typically do not provide efficient and high-resolution diagnosis. Generally speaking, these methods involve accumulating multiple different signatures from the same test and back-calculating likely error locations from the signatures. One complication of these methods is that signatures are accumulated over test intervals consisting of a large number of tests. Accordingly, even if the error locations can be deduced, it is usually not possible to identify which test or tests in the interval failed and what the error locations were for individual failing tests. Moreover, once the signature is contaminated by errors, all subsequent signatures are ordinarily also corrupted irrespective of whether additional errors occur or not. This complicates the detection and data logging of subsequent failing intervals unless the signature is reset or otherwise corrected at the beginning of each interval.

If the signature is reset or corrected for each interval, then signature comparison at the end of the interval can indicate a pass or failure for the respective interval, thus providing some information about error location in time, and the error signature (the difference between the expected and actual signature) can be broadly indicative of the spatial distribution of response errors captured by the tests in the interval.

Although failing signatures corresponding to a large number of test responses may not reveal detailed error locations, they can be useful for identifying some common failure modes if multiple products under test fail during the same intervals and/or exhibit the same failing signatures. However, known mode analysis methods use the raw signatures instead of error signatures and use test intervals that are too long for isolating single-location fail behaviors. Raw signatures are generally less useful because the same failure mode may be overlaid by different test responses due to different stimuli used in different tests. Hence, the same failure mode will still cause different raw failing signatures. Further, certain common defects may manifest themselves with similar fail behaviors in different tests depending on circuit variations and/or environmental conditions. Bridging or open-type defects, for example, can cause intermediate voltage levels that get interpreted differently by downstream logic depending on drive strengths, threshold voltages, and supply voltage. If signatures are accumulated over too many tests, even the error signatures will not match if the same fail behavior occurs in different patterns.

One known signature-based diagnostic method focuses on Logic Built-In Self Test (Logic BIST) and uses three different fault dictionary types. See Liu, C., et al., "Compact Dictionaries for Diagnosis of Unmodeled Faults in Scan-BIST," ISVLSI '04, pp. 173-178 (2004) ("Liu et al."). The first dictionary is a full response dictionary for an initial interval comprising multiple Logic BIST tests. Liu et al. describes intervals of 100 tests or more (e.g., 1000 tests). For a circuit with 100 error measuring locations (scan cells and/or primary outputs) and 1000 tests in the interval, for example, each full response dictionary entry consumes $100 \times 1000 = 10^5$ bits of data. The Liu et al. method reduces the dictionary size by translating each entry into a signature (for example, a 16-bit signature). A matching on-chip signature generation macro is used to capture the test responses for the corresponding test set for comparison with the signatures in the dictionary. The second dictionary contains only pass/fail information for the intervals of consecutive tests. The third dictionary is another full response dictionary that targets conventional scan tests that may have been added to the Logic BIST tests to improve test coverage.

A significant issue with the approach proposed in Liu et al. is that defects do not necessarily behave consistently like single location stuck-at faults. For example, a bridging-type defect may cause a single location to sometimes fail at logic "1" and sometimes at logic "0". The intermediate voltage caused by the short in other tests may not be sufficient to cause a logic fail, even if the corresponding logic stuck-at fault would have been detected. Such inconsistent fail behavior will not exactly match any single location fail behavior if too many tests are grouped into a single test interval with a single composite signature for all tests in the interval.

Table 3 below illustrates this problem. For illustrative purposes only, the number of test patterns per interval shown in Table 3 is five, though Liu et al. suggests much larger intervals.

TABLE 3

Composite Fail Behavior for Test Intervals of Size Five

| | Test Group | | | | | | | | | |
|---|---|---|---|---|---|---|---|---|---|---|
| | A | | | | | B | | | | |
| Test Pattern | 1 | 2 | 3 | 4 | 5 | 6 | 7 | 8 | 9 | 10 |
| Pass/Fail | P | P | F | F | P | F | F | P | P | F |
| Symptom | — | — | $f_1$ | $f_2$ | — | other | $f_3$ | — | — | other |
| Single Location Match | | | No | | | | | No | | |

According to the Liu et al. method, getting an exact signature match with a signature in a fault dictionary would require anticipating all potential compositions of multiple single location behaviors. For test interval A, for example, the combination of $f_1$ in test 3 and $f_2$ in test 4 would have to be included in the first dictionary. For interval B, no success can be expected, because tests 6 and 10 do not fail with any single location symptom. The high number of potential single location behavior combinations means that composite fail behavior for large test intervals cannot be easily captured into a fault dictionary.

Exemplary Embodiments of the Disclosed Diagnostic Methodology

The disclosed methodology can be implemented as part of an overall fault diagnosis system that enables accurate single-case diagnostics for failure analysis as well as fast volume diagnostics for statistical yield monitoring directly from interval signatures. Embodiments of the disclosed methodology can also simplify diagnostic data-logging during production test, thereby better enabling statistical yield monitoring. Embodiments of the disclosed technology can further enable improved common failure mode analyses by using error signatures and short test intervals that are capable of isolating common mode single-location fail behaviors.

Information indicating the error locations with test-by-test or near test-by-test resolution can be very valuable for diagnostics. Thus, the exemplary embodiments described in this section generally concern signature-based test methods that capture a signature for each individual test (or for a small number of consecutive tests, such as five or fewer). In some embodiments, however, the diagnostic resolution is even greater, as multiple signatures are captured for an individual test. The particular embodiments described below are representative embodiments only and should not be construed as limiting in any way. Instead, the scope of the present disclosure includes all novel and nonobvious features and aspects of the various disclosed methods, alone and in various combinations and subcombinations with one another. For example, certain embodiments of the disclosed technology only perform a portion of the diagnostic procedures described (for instance, in some embodiments, either one or both of process blocks 308 and 310 are omitted from the diagnostic procedure). Thus, the disclosed technology is not limited to any specific aspect or feature described, or combination thereof, nor do the disclosed methods, apparatus, and systems require that any one or more specific advantages be present or problems be solved.

Figure 3:
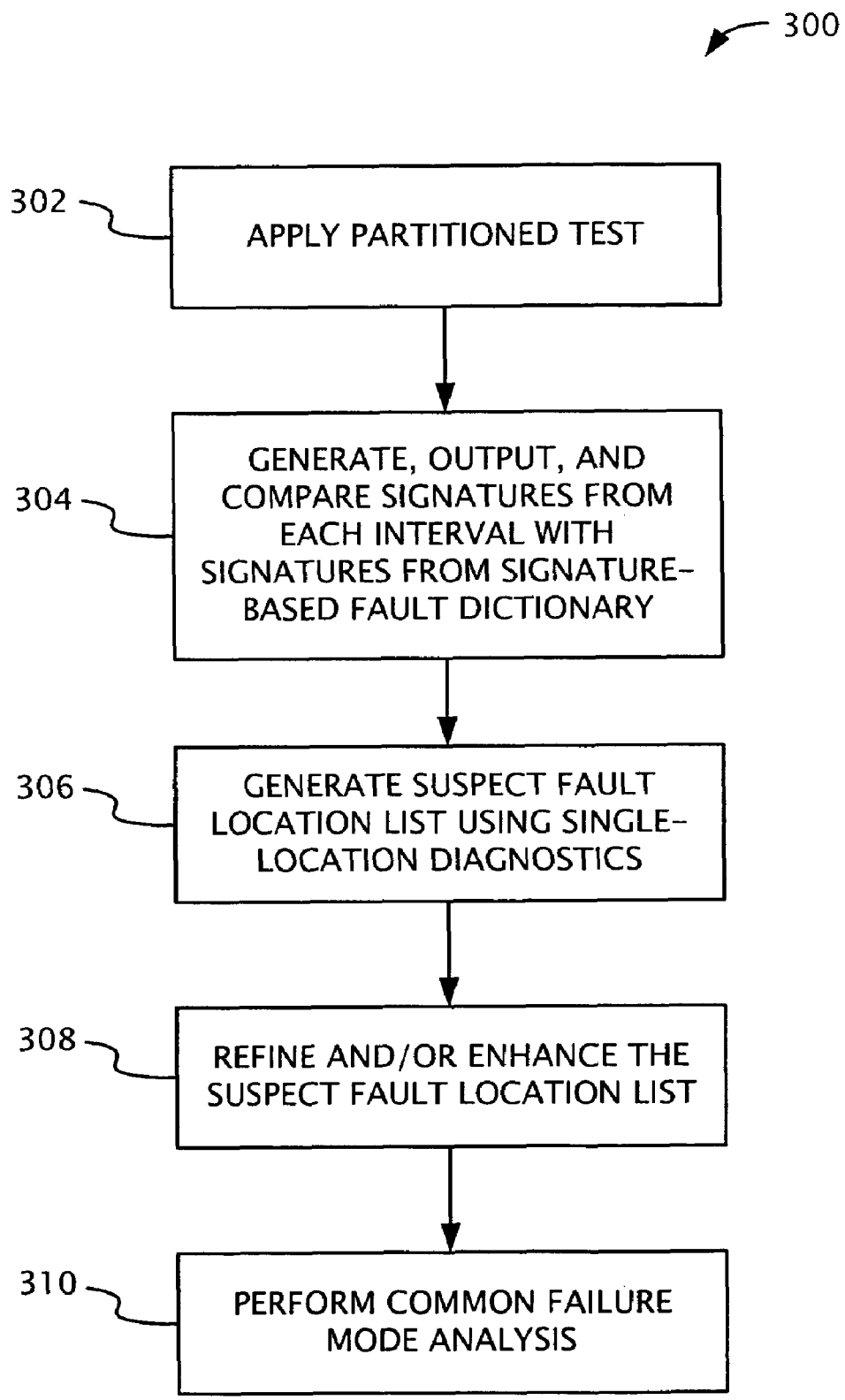
FIG. 3 is a flow chart showing an exemplary method of performing fault diagnosis using a signature-based fault dictionary according to the disclosed technology.

An exemplary representative embodiment of the disclosed diagnostic methodology is shown in the flow chart of FIG. 3. At process block 302, a test set is applied to the design-under-test. In this embodiment, the test set has been partitioned into intervals smaller than the full test set. For example, and most desirably, the intervals correspond to a single test (one test pattern and corresponding test response) or to less than a single test (wherein each respective test is partitioned into two or more intervals). In still other embodiments, the intervals are larger (2 or fewer tests, or 5 or fewer tests).

At process block 304, signatures from each interval are generated, output, and compared to those in a signature-based fault dictionary (for example, a signature-based fault dictionary created from simple model faults, such as stuck-at and/or transition fault models). In some embodiments, the signature generator is located on the circuit having the design-under-test and comprises, for example, a MISR. In other embodiments, however, bit-level test responses are received from the circuit having the design-under-test and the signature is generated by simulating or emulating application of the test responses to a signature generator. Furthermore, in some embodiments, the signature generator (e.g., a MISR) is reset (or otherwise corrected to a known state) between each interval so that previously observed signatures error from one interval will not contaminate or otherwise affect the signatures of subsequent intervals.

The signature-based fault dictionary of this embodiment is created to account for the interval-based application of the test patterns. In general, the interval length of this or any of the disclosed embodiments can be selected in order to account for and better utilize the single-location fail assumption. For example, the interval length can be specified by the user, determined automatically based on a desired resolution, or otherwise determined by the EDA software with which it is used. In desirable embodiments, the interval length corresponds to one test response or less.

At process block 306, an initial suspect fault location list is generated. For example, the initial suspect fault location list can be generated using single-location diagnostics with a signature-based fault dictionary created from simple model faults. Single-location diagnostics typically assume that defects tend to cause fail behaviors that exactly match the fail behavior of simple fault models (for example, a single stuck-at fault location) in at least some failing tests, even though that behavior may not be consistent for all failing and passing tests. Thus, exemplary embodiments of the disclosed direct diagnosis methodology desirably, though not necessarily, use an exact (or complete) matching criteria. For example, in one exemplary embodiment, fault locations with matching behavior for at least one failing test are used to form an initial set of suspect fault locations. The information from this initial set of suspect fault locations may then be used to derive reasonably accurate diagnostic scorings and classifications.

With the single-location assumption, it is possible and practical to use a signature-based fault dictionary based on simple model faults (for example, stuck-at and/or transition fault models) for the initial logic diagnostics. For example, the fault dictionary can be created once, up-front, by performing diagnostic fault simulation for each test interval and for each simple fault. Further, in some embodiments of the disclosed technology, faults are dropped after they have been detected more than some specified or predetermined number of times, such as after two times, three times, or any other desirable number of times. The dictionary of this embodiment is therefore a "stop-on-nth-error" dictionary. As part of dictionary creation, for each fault-detecting interval, the test responses can be compacted into a signature by simulating the same signature generation method that is implemented on the circuit-under-test or otherwise used to compress the test responses. Further, in certain implementations, error signatures can be produced and recorded instead of the raw signatures. The error signatures typically correspond to the difference between the expected fault free signature for the interval and the faulty signature with the fault present. For linear signature generators (such as a Multiple-Input-Signature Registers ("MISRs")), the difference can be calculated as the bitwise Exclusive-OR ("XOR") of the two signatures (though a bitwise XNOR operation can alternatively be used). For instance, circuits-under-test can fail with the same error signature in different patterns even if the raw signatures are different. This commonality in the error signatures can be beneficial for achieving faster common failure mode analysis as well as for further reducing the size of the fault dictionary.

If a defect behaves like a simple model fault during a particular interval, then the simulated raw/error signature in the dictionary will match the raw/error signature observed and logged by the tester in the fail set for the failing circuit under test. Except for some possible aliasing (caused, for example, by multiple faults being mapped into the same error signature for the same interval), the diagnostic resolution of the exemplary methodology is close to or identical to single-location diagnostics using bit-level fail sets.

At process block 308, the initial suspect fault location list is refined and/or enhanced. For example, composite faults can be created from the initial suspect location list and/or a dynamic fault dictionary for additional derived model faults can be optionally generated using fault simulation. The initial set of locations can be used, for instance, to prune or shorten the full fault list and/or to derive additional and more complex faults for post-test fault simulation. For example, the static dictionary can be truncated because of its stop-on-nth-error structure such that no information about a particular fault in the initial list of suspect faults is available for some subsequent tests. The missing entries could be dynamically created by fault simulation of those faults. Additionally, the more complex model faults derived could, for example, be models for open-type defects that propagate to more than one, but not all branches of a fan-out, or models for bridging-type faults between the fault locations in the initial list and physically neighboring nets.

At process block 310, improved common failure mode analysis can be performed. This common failure mode analysis is enabled at least part by the use of error signatures corresponding to short test intervals capable of isolating single-location fail behaviors.

The above methodology can be modified and/or supplemented in a variety of ways. For example, in certain exemplary embodiments, broadside signature comparing can be incorporated into the methodology. See, e.g., Barnhart, C., et al., "OPMISR: The Foundation for Compressed ATPG Vectors," *Proceedings ITC '01*, pp. 748-757 (2001), and Barnhart, C., et al., "Extending OPMISR beyond 10× Scan Test Efficiency," *IEEE Design & Test of Computers*, pp. 65-73 (2002)). In these embodiments, signature-based single-location diagnostics can be improved even further because each failing signature consumes, for example, one cycle in the tester fail memory, whereas the same defect would ordinarily cause several failing scan cycles for conventional scan testing and/or compressed tests using combinational compactors. Thus, on testers with limited fail memory, more failing signature-based tests can be logged. This additional fail information can be used, for example, to achieve better diagnostic resolution.

Furthermore, because the interval signatures of some embodiments are independent from one interval to the next, they naturally provide pass/fail information with interval-level resolution. The corresponding interval-based fault dictionary also desirably contains the same level of pass/fail information. Hence, in addition to exact single-location signature matching, this pass/fail information can be utilized for complementary diagnostic scoring (for example, as described in Sato, Y., et al, "Failure Analysis of Open Faults By Using Detecting/Un-Detecting Information on Tests," *Proceedings ATS '04*, pp. 222-227 (2004)). Moreover, if the intervals are shorter than one test (for example, several signatures are captured and compared during scan unload), the signatures offer additional spatial resolution by directly associating the error signature with corresponding scan chain segments. Thus, the error signature can be associated with a certain interval of scan cells in the scan chains.

Figure 4:
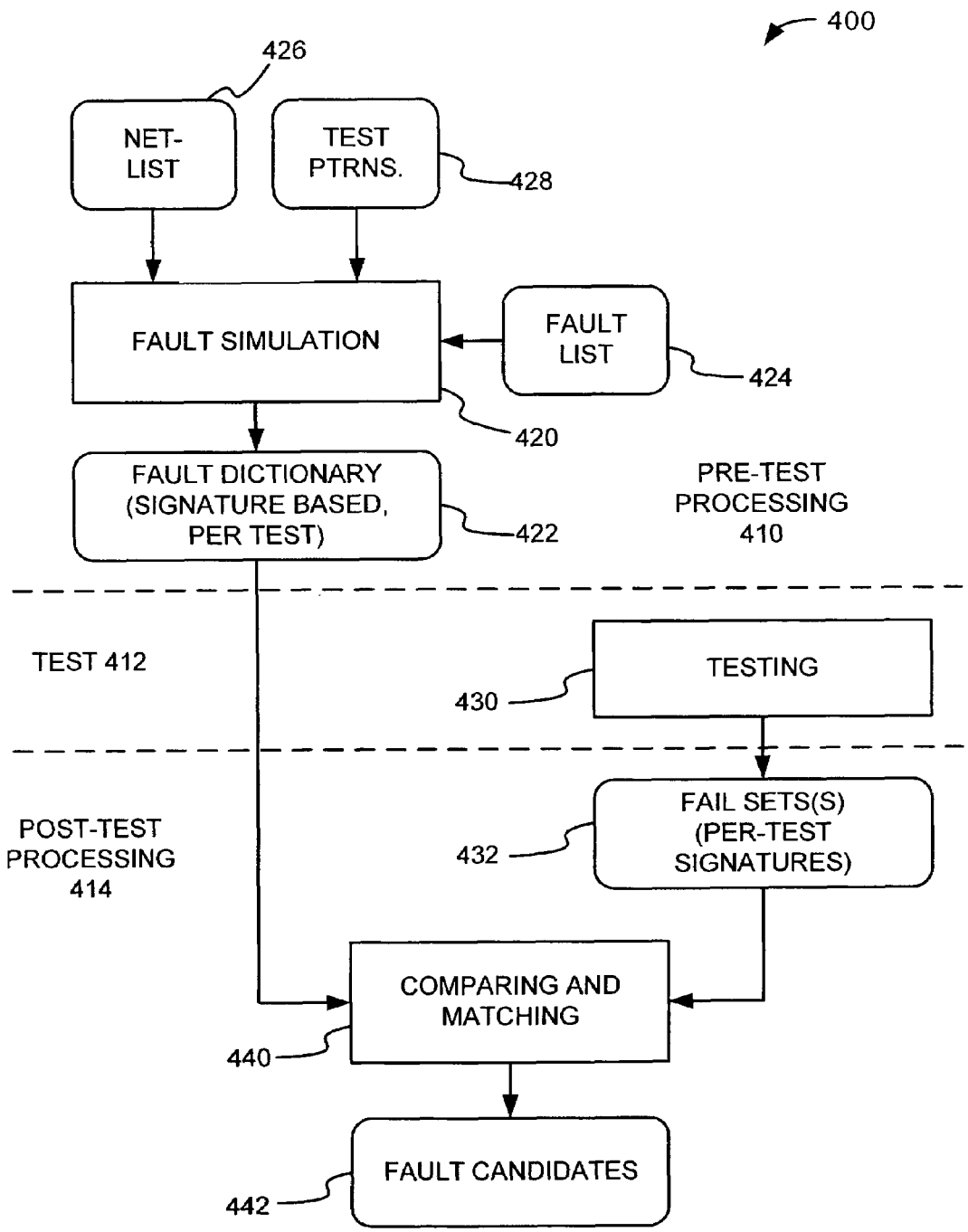
FIG. 4 is a schematic block diagram illustrating an exemplary method of fault diagnosis using a signature-based per-interval fault-dictionary approach for a circuit-under-test having a signature generator.

FIG. 4 is a block diagram 400 illustrating an embodiment of an overall diagnostic scheme using, for example, the diagnostic methodology of FIG. 3 for a circuit-under-test having compression hardware (e.g., a signature generator, such as a MISR). The illustrated embodiment comprises a direct signature-based diagnostic methodology using a pre-calculated compressed fault dictionary with per-test signatures (that is, the signatures are output from the signature generator and diagnosed on a per-test basis, though other partial intervals or plural intervals are possible as noted above). The exemplary method is divided into three phases: a pre-test processing phase 410, a test phase 412, and a post-test processing phase 414.

In the pre-test processing phase 410, fault simulation 420 is performed to generate a fault dictionary 422 comprising entries that indicate what faults may have generated an observed faulty response. Fault simulation 420 can be performed, for example, by simulating the presence of one or more faults (defined by a fault list 424) in the design-under-test (defined, for example, by a netlist 426 or other design database) as one or more test patterns 428 are applied to the design-under-test and after the test responses are compressed by the signature generator coupled to the design-under-test. In FIG. 4, the entries of the fault dictionary 422 correspond to the faulty signatures produced after scan cell unloading a test response to a single test pattern (signature-based, per-test entries). As noted, in some embodiments, the error signatures can be determined and stored rather than the raw signatures. The resulting dictionary 422 can be stored on computer-readable media for use in diagnostics during the post-test processing phase 414.

In the test phase 412, testing 430 of actual circuits is performed. For example, production or manufacture testing of integrated circuits is performed using one or more testers coupled to the circuits shortly after the integrated circuits are manufactured. Testing 430 may also be performed at any time after manufacturing. Testing 430 can generate one or more failing signatures, which can be compiled and stored, in this example, as one or more fail sets 432 of per-test failing signatures.

In the post-test processing stage 416 (which may also occur substantially simultaneously with testing 430), the signatures of the fail sets 432 from testing 430 are compared and matched 440 with entries from the fault dictionary 422. A list of potential faults locations 442 (also referred to as "fault candidates" or "callouts") is produced as a result of the comparison and matching 440. The list of potential fault sites can then be used to help locate the actual fault site on the failing circuit.

Figure 5:
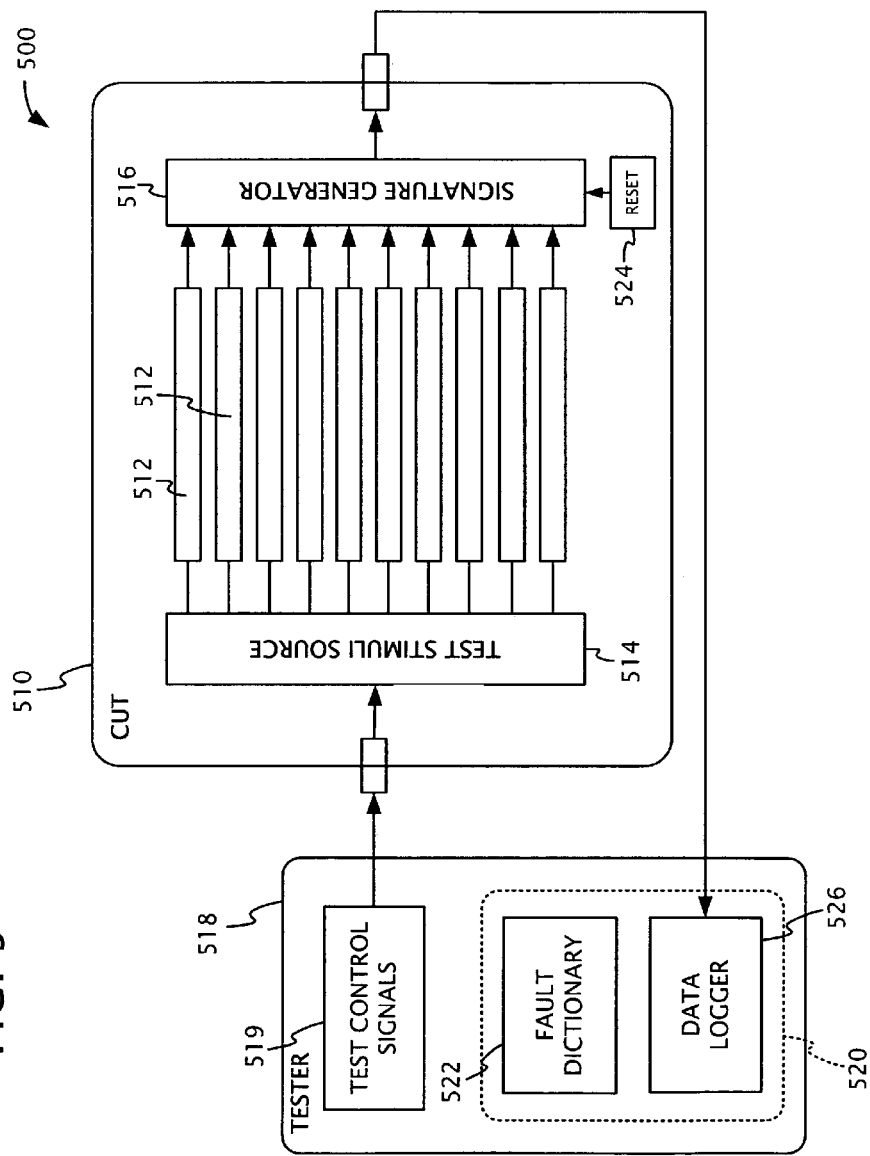
FIG. 5 is a schematic block diagram illustrating an exemplary system in which the method of FIG. 4 can be applied.

In addition to the embodiments discussed above, the present disclosure further encompasses apparatus and systems for performing any of the disclosed methodologies. For instance, FIG. 5 is a block diagram illustrating one such exemplary system 500. the system 500 is a system for performing direct logic diagnostics from compressed response signatures. In the exemplary system 500, the inputs of scan chains 512 in a circuit-under-test 510 are coupled to a test stimulus source 514 (for example, a tester, a decompressor, or a pseudo random pattern generator ("PRPG")). In FIG. 5, the test stimulus source 514 is a PRPG controlled by test control signals output from a test controller 519 in the tester 518. The outputs of the scan chains are coupled to a signature generator 516 (such as a MISR or other suitable compression hardware producing a signature). The signature generator 516 is further coupled to a signature analysis system 520 configured to compare the signature produced by the signature generator 516 to a corresponding expected signature from a fault dictionary 522. The signature analysis system 520 can be part of the tester 518 (as illustrated), or can comprise other dedicated testing hardware (e.g., a separate workstation).

According to one exemplary embodiment, for each test, stimulus data is loaded into the scan chains 512 from the test stimulus source 514. Test events are applied to the logic of the circuit-under-test 510, and test response data is captured in the scan chains 512. The test responses are unloaded from the scan chains 512 into the signature generator 516 and accumulated into a signature. According to one exemplary embodiment, the signature produced by the signature generator 516 is output to the signature analysis system 520 at periodic intervals and compared to a corresponding expected signature. An interval typically comprises a predetermined number of scan cycles. For example, in certain implementations, an interval comprises fewer scan cycles than required to clock out the test response of a single test. Thus, multiple signatures are produced and output from the signature generator 516 for a given test. In other implementations, the size of the intervals corresponds to the size of the test response such that each signature output corresponds to a test. In still other implementations, the intervals comprise more scan cycles than required to clock out a test response of a single test. In these implementations, the signatures produced and output may correspond to multiple tests (e.g., up to two test or up to five tests). Certain embodiments of the disclosed technology further comprise a reset circuit 524 configured to reset or set the signature generator 516 to a known state before subsequent test response values are accumulated in a new signature.

The signature generator 516 used in implementations of the exemplary system 500 can be any of a wide variety of signature generators and can be further modified or enhanced to achieve other desirable functions. For example, in certain implementations, a scan chain masking circuit (not shown) is coupled between the outputs of the scan chains and the inputs of the signature generator. The scan chain masking can be configured, for example, to selectively mask one or more of the scan chains on a test-by-test or cycle-by-cycle basis and be controlled, for example, to mask unknown states from being loaded into the signature generator. In some implementations, a linear phase shifting network (not shown) is coupled between the outputs of the scan chains and the inputs of the signature generator. In still other implementations, a linear space compactor network (not shown) is coupled between the outputs of the scan chains and the inputs of the signature generator, thereby creating an additional compaction stage which does not significantly impact the possible diagnostic resolution.

The exemplary system 500 may further comprise a data logging component 526 (implemented, for example, as a separate or integrated software component) configured to create and store the signature-based fail set. The illustrated data logging component 526 is shown as being integrated with the ATE 218, but it is understood that the data logic component 526 can be implemented elsewhere (e.g., on a separate workstation, diagnostic subsystem, or on the circuit under test 510 itself). The data logging component 526 can be configured to record and/or store a signature-based fail set for each failing circuit under test. The fail set can comprise information about which circuit-under-test the fail set is associated with, the contents of each failing signature, and the test interval that is associated with each failing signature. Furthermore, in certain implementations, the data logging component 526 does not record the failing signature, but rather records the error signature produced by computing the difference between the failing signature and the corresponding expected signature. In still other implementations, the data logging component 526 records both the error signature and the failing signature.

Figure 6:
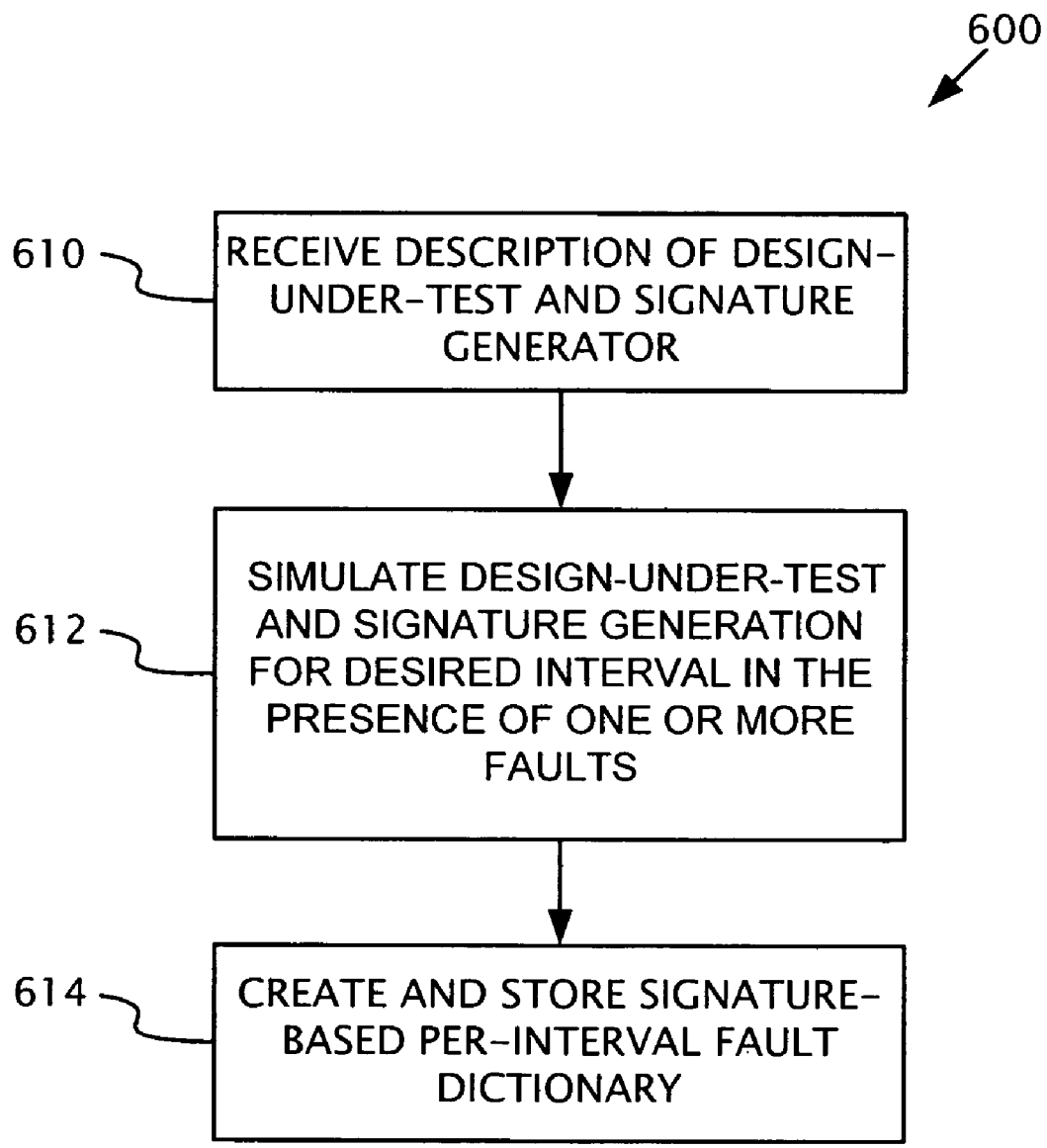
FIG. 6 is a flow chart showing an exemplary method for creating a signature-based per-interval fault dictionary that can be used in the method of FIG. 5.

FIG. 6 is a flow chart of an exemplary method 600 for generating a fault dictionary as may be used in any of the disclosed embodiments. The exemplary method 600 can be implemented, for example, as computer-executable instructions stored on a computer-readable medium.

At process block 610, a description of the design-under-test and signature generator is received. The description can be, for example, a logic netlist or other design file.

At process block 612, the design-under-test and signature generator are simulated for a desired interval of test patterns in the presence of one or more faults. For example, the design-under-test's response to test patterns (e.g., deterministic test patterns or pseudo-random test patterns provided by a PRPG) in a desired interval in the presence of one or more faults is determined through simulation. For example, the faults can be individually simulated in the design-under-test as the test patterns in the interval are applied. The interval can comprise one test pattern, a partial test pattern, or multiple test pattern (e.g., up to 5 test patterns). The faults simulated can comprise a set of modeled faults associated with the logic and other circuit components defined by the netlist. These modeled faults can include, for instance, stuck-at faults, transition faults, and/or other model fault types.

Through fault simulation of the modeled faults and signature emulation, a signature-based fault dictionary is created and persistently stored at process block 614. The signature-based fault dictionary can, for example, contain information that: (1) for each fault, identifies which design under test and test set the fault is associated with; (2) for each fault, identifies one or more tests in which the respective fault is detected (the fault-detecting patterns); (3) for each such fault-detecting pattern, records the emulated fault signature (or error signature) corresponding to the simulated faulty circuit behavior in the presence of the fault; (4) for each fault, contains records for at least a predefined minimum number of the fault-detecting patterns; and/or (5) for some or all of the fault-detecting patterns, indicates whether the associated fault is detected in fewer patterns than the minimum number.

The created dictionary created can be used in a variety of methods. For example, and similar to the method of FIG. 3, failing signatures (or error signatures) associated with a circuit-under-test can be received by a diagnostic system and compared to entries of the fault dictionary. The error signature can comprise, for instance, the difference between the expected fault-free signature and the failing signature. Further, for each failing signature (or error signature) in a fail set, the failing signature (or error signature) can be compared with the emulated failing signatures (or emulated error signatures) corresponding to the same test in the fault dictionary, and if a match between the compared signatures is found, then the corresponding fault and associated test can be recorded and stored in a matching fault list. In some implementations, the matching fault list is sorted and formatted into an initial suspect fault location list (also referred to as an "initial list of fault candidates"). In certain implementations, the emulated fault signatures in the fault dictionary and the failing signatures in the fail sets are further compacted by an additional compaction method.

In some embodiments, post-test fault simulation can be used to recover the full signatures for the fault locations in the matching fault dictionary derived from the compacted signatures, and the recovered full signatures are compared to the full fail signatures to refine the matching fault list. The entries of the initial suspect fault locations list can be further analyzed and combined into groups of composite fault behavior types. The faults in the matching simple fault list and/or composite fault groups can also be used as a basis for additional analysis in which additional derived fault locations and modified fault behaviors are simulated to see if their fault effect matches previously non-matching failing tests and/or passing tests. For example, the faults and/or composite fault groups can be analyzed to identify fault effects associated with a multi-sink net in the netlist, wherein a fault propagates to some but not all fan-out branches of said net. The faults and/or composite fault groups can also be analyzed to identify fault effects that substantially simultaneously appear at and propagate from multiple nets in the netlist. Furthermore, the fault locations in the matching simple fault list can be used as the basis for generating additional fault dictionary entries not contained in the original fault dictionary. These additional entries can correspond to fault detecting tests beyond the minimum number of the fault detecting tests included in the initial fault dictionary. The additional entries can also correspond to additional fault locations in the back-trace cone from the fault locations listed in the matching fault list or from simulated error locations associated with the fault locations in the matching fault list. Moreover, the additional entries can correspond to fault locations that are based on physical proximity and that could favor bridging defects with the fault locations in the matching fault list. In certain embodiments, failing signatures or error signatures are repeated for short intervals and used as indicators for common single-location failure mode analysis.

The embodiments described herein are not limited to just Logic BIST, but can also be adapted for use with other testing architecture using compression hardware. For example, embodiments of the disclosed technology can be adapted for use with the testing architectures described, for example, in Barnhart, C., et al., "OPMISR: The Foundation for Compressed ATPG Vectors," *Proceedings ITC* '01, pp. 748-757 (2001), and Barnhart, C., et al., "Extending OPMISR beyond 10× Scan Test Efficiency," *IEEE Design & Test of Computers*, pp. 65-73 (2002). U.S. Published Patent Application No. US2003/0115525 similarly describes a hardware architecture and test methodology for Logic BIST that can be adapted for use with the disclosed technology. Further, the analysis method described in Bartenstein, T., et al., "Diagnosing Combinational Logic Designs Using the Single Location At-A-Time (SLAT) Paradigm," *Proc. ITC* 2001, pp. 287-96 (2001);

and U.S. Pat. No. 6,721,914 (sometimes referred to as SLAT) can also be adapted for use with the disclosed technology.

Exemplary Computing Environments

Figure 7:
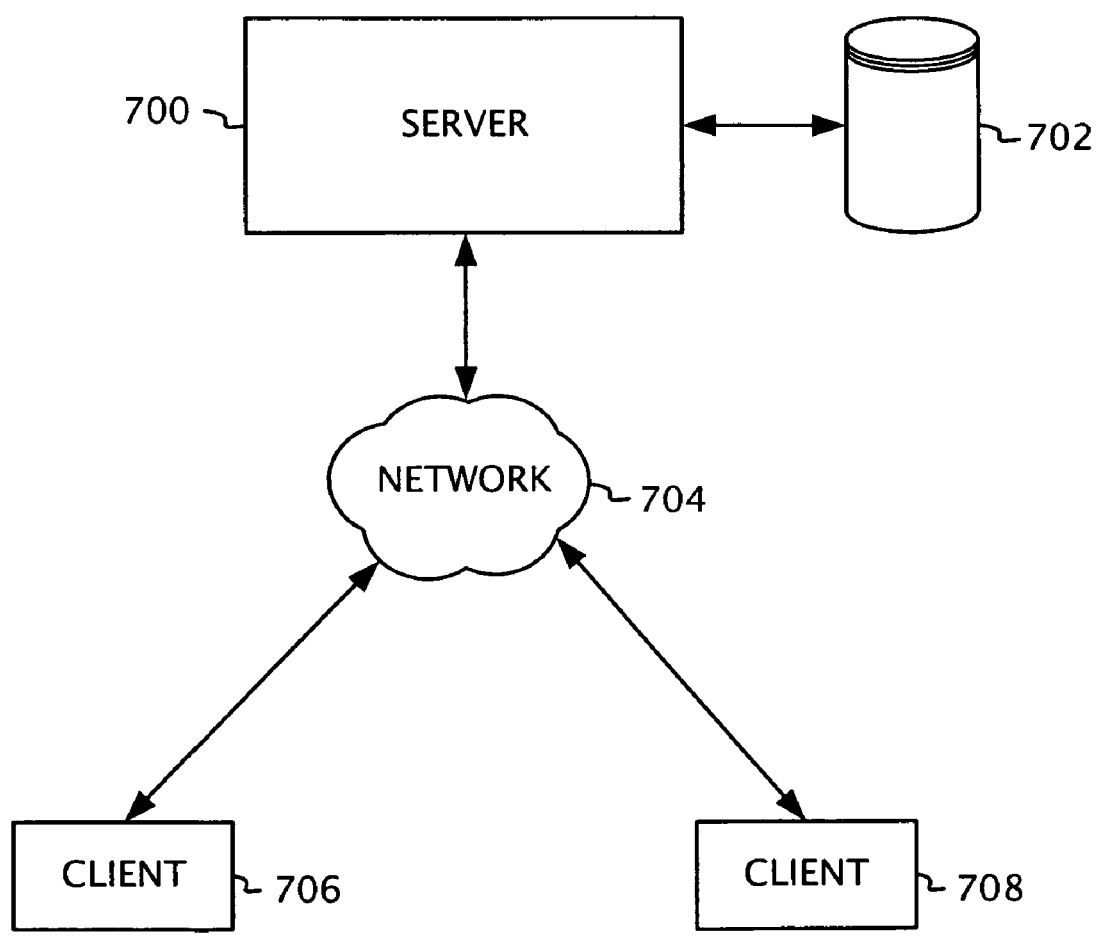
FIG. 7 is a schematic block diagram illustrating a computer network in which embodiments of the disclosed technology can be used.
Figure 8:
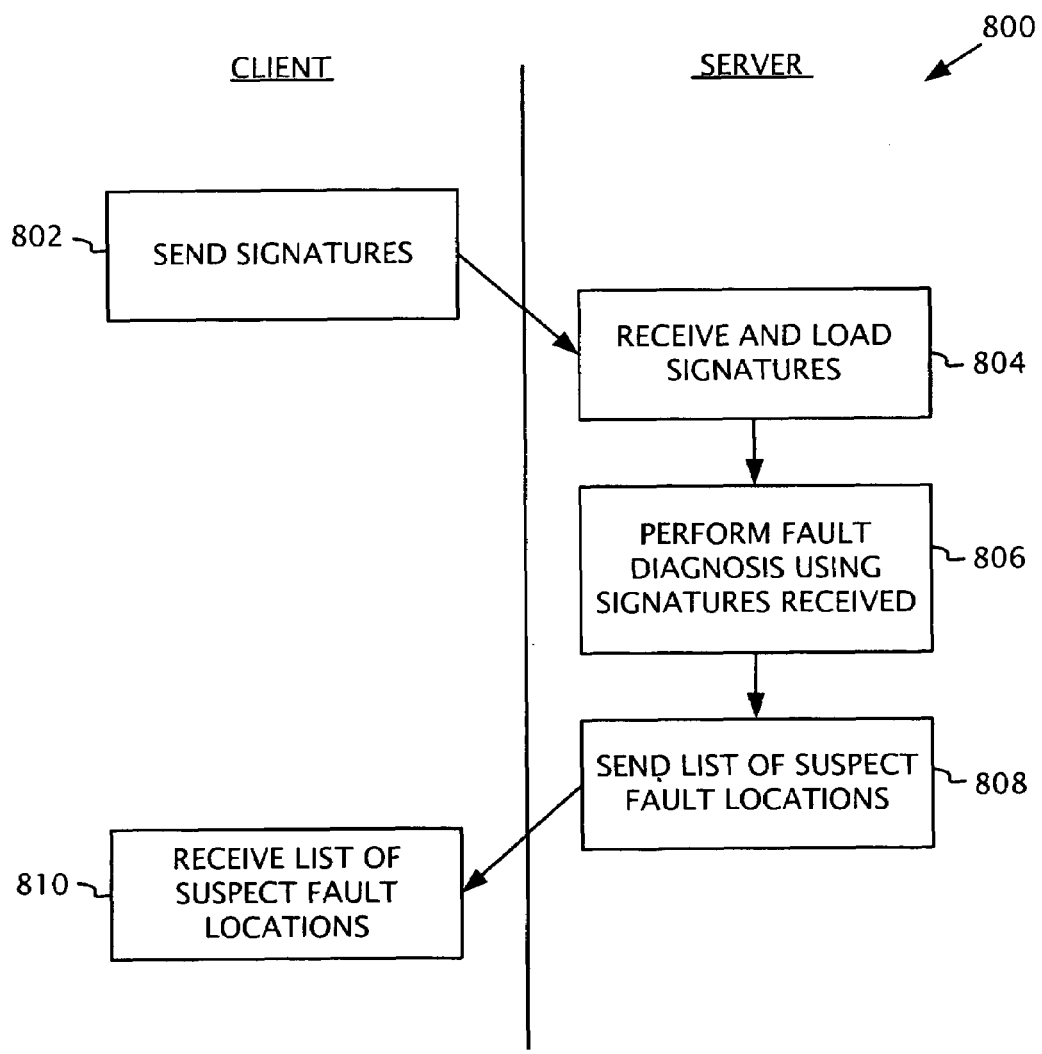
FIG. 8 is a flow chart illustrating how fault diagnosis can be performed in the network of FIG. 7 using any of the disclosed techniques.

Any of the aspects of the technology described above may be performed using a distributed computer network. FIG. 7 shows one such exemplary network. A server computer 700 can have an associated storage device 702 (internal or external to the server computer). The server computer 700 may be coupled to a network, shown generally at 704, which can comprise, for example, a wide-area network, a local-area network, a client-server network, the Internet, or other such network. One or more client computers, such as those shown at 706, 708, may be coupled to the network 704 using a network protocol. In one example, the client computer can be configured to receive signatures (error signatures or raw failing signatures) from a tester on a production floor (for example, the client computer can be part of the tester, remotely coupled to the tester, or receive the signatures stored on one or more computer-readable media). FIG. 8 shows how the client computer may then interface with the server computer 700 in order to perform fault diagnosis.

FIG. 8 shows that a database or data structure containing the signatures may be analyzed according to any of the embodiments disclosed herein using a remote server computer, such as the server computer 700 shown in FIG. 7. At process block 802, for example, the client computer sends the signatures. Information concerning the architecture of the circuit-under-test may be sent as part of this process as well (for example, a netlist). In process block 804, the signatures are received and loaded by the server computer. In process block 806, fault diagnosis is performed using any of the disclosed embodiments. At process block 808, the server computer sends the result of the diagnostic procedure (for example, a list of fault candidates or suspect fault locations) to the client computer, which receives the results at process block 810. It should be apparent to those skilled in the art that the example shown in FIG. 8 is not the only way to perform fault diagnosis using multiple computers. For instance, the signatures may be stored on one or more computer-readable media that are not on a network and that are sent separately to the server (for example, one or more CD-ROMs, DVDs, or portable hard drives). Or, the server computer may perform only a portion of the fault diagnostic procedure. A networked or distributed computing environment can also be used to generate the fault dictionary used during diagnostics.

Having illustrated and described the principles of the illustrated embodiments, it will be apparent to those skilled in the art that the embodiments can be modified in arrangement and detail without departing from such principles. In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. A method of diagnosing faults in a circuit, comprising:
    receiving a signature produced by a signature generator, the signature corresponding to the circuit's response to no more than one test pattern;
    comparing the signature to entries of a fault dictionary;
    matching an entry of the fault dictionary to the signature if the entry identifies a fault that explains the signature; and
    storing the fault in a list of fault candidates.

2. The method of claim 1, wherein the signature generator is located on the circuit, and wherein the signature is produced by the signature generator during production testing of the circuit.

3. The method of claim 1, wherein the signature generator is a representation of a signature generator, the method further comprising receiving the circuit's bit-level response to the no more than one test pattern and determining the signature corresponding to the circuit's bit-level response using the representation of the signature generator.

4. The method of claim 1, wherein the signature corresponds to the circuit's response to a portion of a test pattern, and wherein one or more subsequent signatures correspond to the circuit's remaining response to the test pattern.

5. The method of claim 1, wherein the list of fault candidates is an initial list of fault candidates, the method further comprising combining two or more of the fault candidates into one or more groups of composite fault behavior types.

6. The method of claim 1, further comprising,
    simulating one or more of the fault candidates in the list; and
    identifying additional fault candidates based at least in part on the simulation.

7. The method of claim 1, further comprising generating one or more additional entries for the fault dictionary using one or more of the fault candidates in the list.

8. The method of claim 7, wherein the additional entries are in the back-trace cones of the one or more fault candidates used to generate the additional entries.

9. The method of claim 1, further comprising identifying additional fault candidates based on their physical proximity to the fault candidates in the list of the fault candidates.

10. The method of claim 1, wherein the signature is an error signature indicating the difference between an observed signature and an expected signature.

11. The method of claim 1, wherein the signature is a raw signature output from the signature generator.

12. The method of claim 1, further comprising resetting the signature generator to a known state before a next signature is generated.

13. The method of claim 1, wherein the storing includes storing the fault in the list of fault candidates only if the fault has been observed a fixed number of times in signatures received from the circuit.

14. The method of claim 1, wherein the method is performed by a tester coupled to the circuit during testing.

15. The method of claim 1, wherein the method is performed by a workstation not coupled to the tester.

16. One or more computer-readable media storing the list of fault candidates produced at least in part using the method of claim 1.

17. A circuit having a circuit design modified in response to one or faults being detected by the method of claim 1.

18. A circuit having a repaired defect, the defect having been detected by the method of claim 1.

19. A method of diagnosing faults in a circuit, comprising:
    receiving a signature produced by a signature generator, the signature corresponding to the circuit's response to five or fewer test patterns;
    comparing the signature to entries of a fault dictionary;
    matching an entry of the fault dictionary to the signature if the entry identifies a fault that explains the signature; and
    storing the fault in a list of fault candidates.

20. A method of producing a signature-based fault dictionary for use in diagnosing faults in a circuit, comprising:
    receiving a description of a circuit design;

simulating a response of the circuit design to application of a test pattern, the simulating including simulating the presence of one or more faults in the circuit design;

simulating a signature generator at least partially loading the test response and generating a signature for the at least partially loaded test response; and storing an entry in a fault dictionary associated with the signature and indicative of the one or more faults if the signature is a failing signature.

21. The method of claim 20, wherein the signature simulated is for a portion of the test response.

22. The method of claim 20, wherein the signature simulated is for the entire test response.

23. The method of claim 20, wherein the entry stored in the fault dictionary includes the signature itself.

24. The method of claim 20, wherein the entry stored in the fault dictionary includes an error signature produced from the signature.

25. The method of claim 20, further comprising compressing the entries of the fault dictionary.

26. The method of claim 20, further comprising repeating the simulating and the storing for additional respective test patterns.

27. The method of claim 26, wherein the repeating includes simulating the presence of a respective fault during the simulating until the respective fault is detected in a predetermined number of signatures, and thereafter removing the respective fault from a list of faults to be simulated.

28. The method of claim 20, wherein the faults are modeled faults comprising stuck-at faults, transition faults, or both stuck at-faults and transition faults.

29. One or more computer-readable media storing the fault dictionary produced at least in part using the method of claim 20.

30. A system, comprising:
a circuit-under-test having one or more scan chains;
a signature generator having inputs coupled to outputs of the one or more scan chains, the signature generator being operable to generate signatures associated with at least a portion of one or more circuit test responses captured in the scan chains, the signature generator being further operable to output the signatures after an interval of scan cycles; and
a signature analysis subsystem coupled to receive the signatures from the signature generator, the signature analysis subsystem being configured to compare a respective signature received from the signature generator to entries of a fault dictionary and to create a list of potential fault candidates if the respective signature is a failing signature and if the failing signature matches one or more entries in the fault dictionary, the potential fault candidates in the list being identified by the one or more matching entries of the fault dictionary.

31. The system of claim 30, further comprising circuit components coupled to the signature generator and configured to reset the signature generator to a known state after the interval of scan cycles.

32. The system of claim 30, further comprising masking hardware coupled between the inputs of the signature generator and the outputs of the scan chains, the masking hardware being configured to mask one or more outputs of the scan chains for one or more scan cycles.

33. The system of claim 30, further comprising a linear phase shifting network coupled between the inputs of the signature generator and the outputs of the scan chains.

34. The system of claim 30, further comprising a spatial compactor coupled between the inputs of the signature generator and the outputs of the scan chains.

35. The system of claim 30, wherein the signature generator is a multiple input signature register ("MISR").

36. The system of claim 30, wherein the signature analysis subsystem comprises a data logging subsystem configured to receive the signatures and associate the received signatures with information indicative of one or more of (a) an identity of the circuit-under-test with which a respective received signature is associated, (b) the content of the failing signature, and (c) an identity of the interval with which the respective received signature is associated.

37. The system of claim 30, wherein the interval corresponds to five or fewer circuit responses being loaded into the signature generator.

38. The system of claim 30, wherein the interval corresponds to two or fewer circuit responses being loaded into the signature generator.

39. The system of claim 30, wherein the interval corresponds to a single circuit response being loaded into the signature generator.

40. The system of claim 30, wherein the interval corresponds to less than a single circuit response being loaded into the signature generator.

41. A circuit having a circuit design modified in response to one or faults being detected by the system of claim 30.

42. A circuit having a repaired defect, the defect having been detected by the system of claim 30.

* * * * *